United States Patent [19]

Meliga

[11] Patent Number: 5,276,702
[45] Date of Patent: Jan. 4, 1994

[54] GAIN-COUPLED DISTRIBUTED-FEEDBACK SEMICONDUCTOR LASER

[75] Inventor: Marina Meliga, Turin, Italy

[73] Assignee: CSELT-Centro Studi e Laboratori Telecommunicazioni S.p.A., Turin, Italy

[21] Appl. No.: 882,294

[22] Filed: May 13, 1992

[30] Foreign Application Priority Data

May 13, 1991 [IT] Italy .................. TO 91 A 000352

[51] Int. Cl.⁵ ................................................ H01S 3/08
[52] U.S. Cl. .......................................... 372/96; 372/46; 372/45
[58] Field of Search ............................ 372/96, 46, 45

[56] References Cited

U.S. PATENT DOCUMENTS

4,633,476  12/1986  Seifres et al. .................... 372/96

OTHER PUBLICATIONS

H. Kolgenick, C. V. Shank "Coupled Wave Theory of Distributed Feedback Lasers", Journal of Applied Physics, vol. 43, No. 5, May 1972.
Y. Luo et al. "Gain Coupled DFB Semiconductor Laser Having Corrugated Active Layer" presented at International Conference on Solid State Devices ..., Tokyo, Aug. 1988, paper 20DPB-2.
Purely Gain-Coupled Distributed Feedback Semiconductor Lasers 320 Applied Physics Letter-vol. 56, No. 17 Apr. 23, 1990, NY Y. Luo et al.
Electronics Letter, vol. 24, No. 16, Aug. 1988, Stevenage, Herts pp. 985-986.
Patent Abstracts of Japan JP-A-10 21 986.
Patent Abstracts of Japan—JP A-21 63 928.
Patent Abstracts of Japan—JP A-21 43 580.
JP Abstracts 1-17487(A).
JP Abstracts 1 106489 (A).

Primary Examiner—Georgia Y. Epps
Attorney, Agent, or Firm—Herbert Dubno

[57] ABSTRACT

In a distributed feedback semiconductor laser, the active medium has a periodic thickness variation in the light propagation direction so as to generate a periodic gain variation, while maintaining the effective refractive index constant, and has a discrete multi-quantum wire structure.

7 Claims, 1 Drawing Sheet

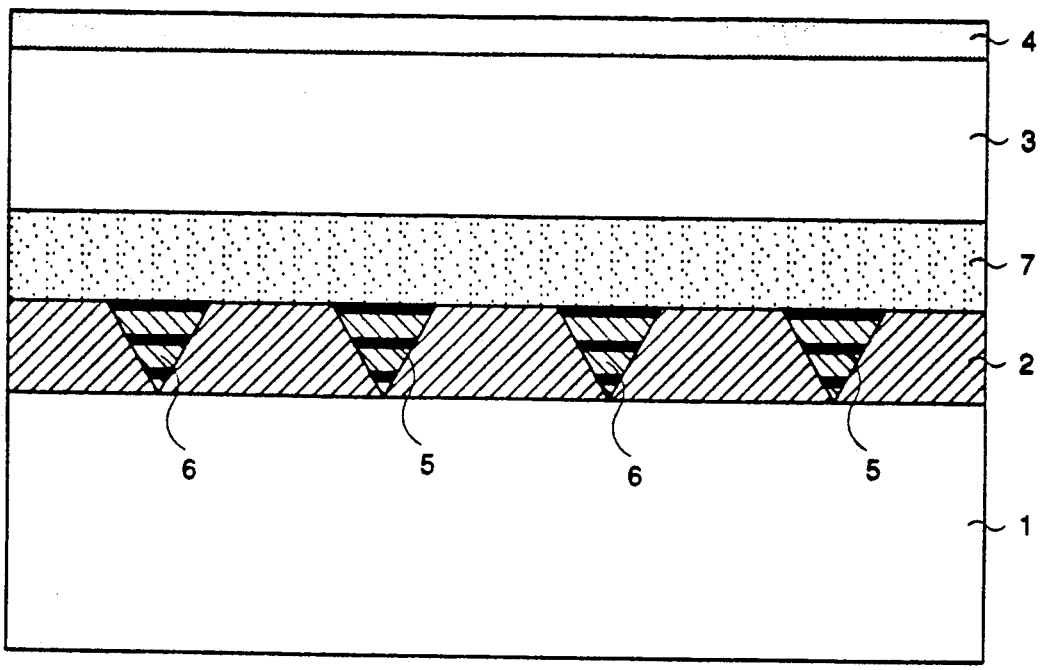

GAIN-COUPLED DISTRIBUTED-FEEDBACK SEMICONDUCTOR LASER

FIELD OF THE INVENTION

The present invention relates to opto-electronic components for optical communications systems, and, more particularly, to a gain-coupled distributed-feedback semiconductor laser to be used as a source in one of such systems.

BACKGROUND OF THE INVENTION

In optical communications systems and, more particularly, in long-haul communications systems, sources capable of emitting single-frequency signals are of primary interest in order to reduce as much as possible signal distortion due to the different propagation rates of the different frequencies. This condition is essential in the case of high-speed direct source modulation and for use in coherent communications systems.

Semiconductor lasers in which optical feedback is obtained by other mechanisms than multiple reflections between the mirrors delimiting the laser cavity are examples of sources meeting the above requirement. In those lasers a selection of the oscillation free (or modes) is obtained without resorting to external components, so that the laser can be fabricated by integrated-optics circuit technology. Moreover, owing to the absence of the end mirrors, the devices are suitable for integration with other components of an optical communications system. Some examples of such lasers are Distributed Bragg Reflector (DBR) lasers and Distributed-Feedback (DFB) lasers. The latter lasers are of simpler manufacture and hence are presently preferred.

Generally, in DFB lasers, optical feedback is obtained thanks to a periodic spatial variation in the effective refractive index (i.e. the refractive index presented by the whole structure for the guided radiation) in the light propagation direction (longitudinal direction). This variation is caused by a grating extending across the whole cavity on or beneath the laser active layer. This optical feedback mechanism is commonly known as "index coupling" and exploits the fact that each refractive index change is accompanied by a weak reflection in the guided radiation. By a suitable choice of the grating period, back reflection will be obtained, and the grating acts as a wavelength-selective mirror, which reflects only the wavelengths closer to that which meets the Bragg condition $$\Lambda = m \frac{\lambda_B}{2n_v} \quad (1)$$

where
$\Lambda$ = grating period
$\lambda_B$ Bragg wavelength
m = grating order
$n_v$ = mode refractive index In practice, $\lambda_B$ is chosen so as to be coincident with the emission wavelength of the laser active layer.

Yet, index-coupled DFB lasers are not per se monomode sources, and their behavior, in terms of emitted modes, is highly sensitive to reflections on the end facets. More particularly, if those facets are left untreated, the oscillation modes of the laser depend on the relative positions of the facets with respect to the grating spatial phase, which position is entirely casual, since it is impossible to exactly determine at which point a grating will be cut upon manufacturing the individual devices. If the laser facets are covered with antireflecting coatings, the laser will steadily oscillate on two modes symmetrical with respect to Bragg wavelength. In the latter case monomodality can be achieved by causing the rays propagating in the laser to undergo a quarter-wave phase shift in the central grating zone. This phase shift is obtained by eliminating a groove of the grating in such a zone, which operation is rather complicated from the technological standpoint. The operations necessary to manufacture a grating presenting the phase shift and to apply the antireflecting coatings cause such a cost increase that generally, in the industrial production of such lasers, it is preferred to keep which are monomode by fabrication and to discard the others. Notwithstanding the elimination of a considerable proportion of the production, this approach is still advantageous from the economic standpoint.

The problems of high costs or wastes can be solved by manufacturing a DFB laser where a longitudinal periodic gain variation (gain coupling) occurs instead of a periodic refractive-index variation. It has been theoretically shown (H. Kolgenick, C. V. Shank: "Coupled Wave Theory of Distributed Feedback Lasers", Journal of Applied Physics, Vol. 43, No. 5, May 1972) that a DFB laser is intrinsically a monomode structure and is relatively insensitive to facet reflections, so that no expensive machining such is required for phase-shift introduction in the grating and application of antireflecting coatings is necessary.

An example of gain-coupled DFB laser is described by Y. Luo et al. in the paper entitled "Gain Coupled DFB Semiconductor Laser Having Corrugated Active Layer" presented at the International Conference on Solid Slate Devices and Materials, Tokyo, August 1988, paper 20DPB-2, and issued at pages 328-330 of the proceedings of such a Conference. That paper describes a GaAs/GaAlAs laser, comprising, between conventional confinement layers of GaAlAs (lower and upper claddings), a corrugated layer or grating (pattern-providing layer), this too made of GaAlAs, but with such relative proportions of the constituent elements as to give a refractive index which is high if compared to the lower and upper claddings and is close to that of the active layer. The grating is followed by a further corrugated layer, always made of GaAlAs ("buffer layer"), who index is low but slightly higher than that of the lower and upper claddings. The active layer of undoped GaAs is deposited on the buffer layer in such as to obtain a planar structure. In this way a periodic thickness variation is obtained which causes a periodic gain variation. The refractive indices of the various layers and the heights of the teeth of the pattern-providing layer and the active layer are chosen so that the effective refractive index remains constant in longitudinal direction, so as to obtain a laser with pure gain-coupling.

This known structure has a number of disadvantages due to the presence of a massive active layer, which does not allow attainment of high values not only of the absolute gain, but also of the differential gain (dg/dN, where g=absolute gain, N=number of the injected carriers). As is known, the higher the differential gain, the better the spectral line-width characteristics of the laser and more generally the dynamic properties of the device (frequency behavior, frequency modulation, etc.).

SUMMARY OF THE INVENTION

To overcome these disadvantages a semiconductor laser and a method of fabricating same are provided, wherein no massive layer of active material is used, so that good performance can be attained in terms of absolute and differential gain.

In the laser according to the invention, the active material is present only in the grating grooves and consists of discrete layers alternating with layers of a passive material with wider band gap. The layers form in each groove the wires and the barriers, respectively, of a multi-quantum wire structure, oriented perpendicularly to the light propagation direction.

A quantum structure, as known, yields a gain which is some times higher than that of a continuous structure (3 to 4 times higher in case of quantum wells and even higher in case of wires) and, moreover, it yields also a better differential gain. As a consequence, relatively high output powers as well as good dynamic properties can be achieved. It is already known to use to this aim quantum structures, and more particularly multi-quantum well structures, in the active layers of coupled-index distributed-feedback semiconductor lasers. However, such lasers present the drawbacks stated above with respect to the obtention of monomodality. Moreover, one cannot even think to intervene on the already deposited active material to obtain a structure similar to the one suggested according to the invention, with a plurality of discrete multi-quantum wire structures, since, as is known, any intervention on the active material causes the occurrence of faults (more particularly, non-radiative recombining centers) in the device.

The invention also provides a method of fabricating a laser according to the invention, wherein a plurality of layers of active material alternating with layers of a passive material with wider band gap are grown in each groove of the grating, so as to form a multi-quantum wire structure orthogonal to the light propagation direction, the active and passive layers forming the wires and the barriers, respectively, of said structure.

BRIEF DESCRIPTION OF THE DRAWING

The invention will be described in greater detail with reference to the accompanying drawing, the sole FIGURE of which is a longitudinal section through a laser according to the invention.

SPECIFIC DESCRIPTION

By way of example the invention is described with reference to a laser made of InP/InGaAs/InGaAsP; the description also applies in case of a laser using different constituent elements, e.g. GaAs/GaAlAs.

The laser of the invention comprises, in conventional manner, a substrate 1 of suitably doped InP (e.g. n-doped), a grating 2 of quaternary InGaAsP alloy, the upper cladding 3 of InP doped in opposite manner to layer 1 (hence p-doped) and a contact layer 4 of highly-p-doped InGaAsP, allowing electrode application. Grating 2 has a period satisfying the above mentioned Bragg condition. In addition, the constituent element proportions in the quaternary alloy of which the grating is made are chosen so as to yield a refractive index satisfying determined conditions which will be reported hereinafter.

The optically active material is present only in the grating grooves and consists of discrete layers 5 of InGaAs, separated by layers 6 of a passive material of wider band gap, e.g. InP or an InGaAsP alloy. Layers 5, 6 are made so as to form the wires and the barriers of a quantum wire structure. The thicknesses of the layers of active material are chosen so as to provide the desired emission wavelength (e.g. 1.55 μm). This thickness, as is known, is perfectly determined once the materials forming the wires and the barriers are determined.

The number of layers 5 is chosen in the design step so as to optimize laser performance. More particularly, this number is chosen so as to meet the so-called threshold condition, according to which mode gain must be equal to losses. This condition is expressed by the relation $$\Gamma \cdot g = \alpha$$

where
 $\Gamma$ = optical confinement factor, i.e. the part of the electromagnetic field contained in one layer;
 g = active material gain
 $\alpha$ = total losses.

As is known, gain g of a quantum structure is a few times higher than that of a massive structure. The confinement factor is, on the contrary, lower. By varying the number of the layers one can change $\Gamma$ so as to satisfy the above condition.

When optical confinement increase is desired, a further layer 7 of quaternary InGaAsP alloy can be provided upon the grating and the quantum-wire structure. The thickness of layer 7 is determined in the design step in order to increase $\Gamma$ and make meeting of the threshold condition easier.

It is clear that the described structure presents a periodic gain variation, since the active material is present only in the grating grooves. Making the active layer as a multi-quantum wire structure ensures advantages in terms of absolute and differential gain inherent in this type of structure.

In order to fabricate the laser described, once grating 2 is formed with the techniques generally used for this, in DFB laser fabrication (more particularly holography or electron beam lithography), quantum wires are grown in the grating grooves. To this aim the techniques commonly used to fabricate quantum well or quantum wire structures can be adopted, e.g. molecular beam epitaxy or vapor phase deposition (or vapor phase epitaxy) of organometallic compounds. Care has to be taken in order to fabricate quantum structures only in the grooves or at least to ensure an easy removal of material of structures grown outside the grooves. E.g., if the surface of grating 2, in zones between grooves, is kept covered, during the operations leading to the growth of the quantum structures, with the photoresist layer applied during etching operations, the material of quantum structures possibly grown on the layer has a polycrystalline structure instead of a crystalline one, and hence is easy to remove, as it is well known by those skilled in the art.

It is important to avoid growth of quantum structure material on the grooves walls since that would cause active material continuity inside the groove and hence would annul the advantages deriving from the presence of a discrete structure. This can be made easier if the grooves, instead of being exactly V-shaped, have a non null width in the zone corresponding to the vertex.

The successive layers are then made in a fully conventional manner. Also lateral light confinement is obtained in quite conventional manner, by making a ridge structure or a buried structure.

To ensure monomodality, the laser must present gain coupling alone, without index coupling. To obtain this, the grating material composition must be chosen so that the effective refractive index n in the zones where there are no quantum structures satisfies relationship $$N = \frac{Nw \cdot tw \cdot nw + Nb \cdot tb \cdot nb}{Nw \cdot tw + Nb \cdot tb} \quad (2)$$

where: Nw, Nb are respectively the number of quantum wires and barriers; tw and tb are the wire and barrier thicknesses; nw, nb are the refractive indices.

It is always possible to find a quaternary InGaAsP alloy with refractive index n meeting condition (2), since, as is known, the refractive index in such alloys varies with continuity from the value corresponding to InGaAs to that corresponding to InP when varying the proportions of Ga, As and P. Relation (2) clearly indicates that, in case a quaternary InGaAsP alloy is used to make the barriers, its composition shall be different from that of the alloy used for the grating.

What has been described applies also to lasers made of GaAs/GaAlAs. In such case quantum wires 5 are made of GaAs and barriers 6 of GaAlAs. Grating 2, in order to satisfy condition (2) for the refractive index, will be made of a GaAlAs alloy of a composition capable of yielding a lattice parameter different from that of the layer on which it is grown ("strained" material).

I claim:

1. In a gain-coupled distributed-feedback laser, wherein optical feedback is obtained by means of a grating of passive semiconductor material extending an entire length of the laser length in a light propagation direction, and wherein an active medium has a periodically changing thickness so as to introduce a periodic gain variation, the improvement wherein the active medium is present only in grooves of the grating and comprises discrete layers alternating with layers of a semiconductor material of different band gap, which layers form in each groove respectively wires and barriers of a multi-quantum wire structure, oriented perpendicular to the light propagation direction.

2. The improvement defined in claim 1 wherein an optical confinement layer is provided on the grating and the multi-quantum wire structure.

3. The improvement defined in claim 1 wherein the grating is made of a material whose refractive index is such that the effective refractive index, outside the grooves, satisfies a condition $$N = \frac{Nw \cdot tw \cdot nw + Nb \cdot tb \cdot nb}{Nw \cdot tw + Nb \cdot tb}$$

where Nw and Nb are the number of wires and of barriers respectively; tw and tb are the thicknesses of the wires and the barriers respectively; nw and nb are the refractive indices of the wires and the barriers respectively, so as to ensure constancy of an effective refractive index in the light propagation direction.

4. A method of fabricating a gain-coupled distributed-feedback laser, wherein optical feedback is obtained by means of a grating of passive semiconductor material extending an entire length of the laser length in a light propagation direction, and wherein an active medium has a periodically changing thickness so as to introduce a periodic gain variation, in which on a layer of a first passive semiconductor material the grating of a second passive material is forms, said method comprising the steps of growing a plurality of layers of active material separated by layers of a further passive material with a wider band gap in each groove of the grating, so as to form a quantum wire structure orthogonal to the light propagation direction.

5. The method defined in claim 4 wherein said grooves have a nonzero width in correspondence at their vertices, to avoid active material growth on groove walls.

6. The method defined in claim 4 wherein while growing the quantum wire structures, surface portions of the grating between adjacent grooves are kept covered with a photoresist layer interacting with the quantum wire material to confer to it a structure allowing an easy removal of such material possibly grown outside the grooves.

7. The method defined in claim 4 wherein an optical confinement layer is deposited on the grating and quantum wire structures.

* * * * *